(12) United States Patent
Lee et al.

(10) Patent No.: US 6,998,669 B2
(45) Date of Patent: Feb. 14, 2006

(54) MEMORY CELLS WITH NONUNIFORM FLOATING GATE STRUCTURES

(75) Inventors: Jae-Duk Lee, Gyeonggi-do (KR); Dong-gun Park, Gyeonggi-do (KR); Jeong-Hyuk Choi, Gyeonggi-do (KR)

(73) Assignee: Samsung Electronics Co. Ltd., (KR)

( * ) Notice: Subject to any disclaimer, the term of this patent is extended or adjusted under 35 U.S.C. 154(b) by 160 days.

(21) Appl. No.: 10/726,768

(22) Filed: Dec. 3, 2003

(65) Prior Publication Data
US 2005/0006695 A1    Jan. 13, 2005

(30) Foreign Application Priority Data
Dec. 5, 2002    (KR) .................. 10-2002-0076956

(51) Int. Cl.
*H01L 29/788*    (2006.01)
(52) U.S. Cl. .............. 257/315; 257/314; 257/316; 438/257

(58) Field of Classification Search .............. None
See application file for complete search history.

(56) References Cited

U.S. PATENT DOCUMENTS 6,706,592 B1 *    3/2004    Chern et al. ............. 438/257
2004/0084713 A1 *    5/2004    Hsieh .................... 257/315

\* cited by examiner

*Primary Examiner*—David Nelms
*Assistant Examiner*—Long Tran
(74) *Attorney, Agent, or Firm*—Myers Bigel Sibley & Sajovec

(57) ABSTRACT

In a floating gate memory cell including a floating gate separated from an active region by a tunnel isolation region, a first one of the active region and the floating gate comprises a portion that protrudes towards a second one of the active region and the floating gate. In some embodiments, the protruding portion tapers toward the second one of the active region and the floating gate. The tunnel insulation layer may be narrowed at the protruding portion. Protruding portions may be formed on both the floating gate and the active region.

7 Claims, 13 Drawing Sheets

MEMORY CELLS WITH NONUNIFORM FLOATING GATE STRUCTURES

RELATED APPLICATION

This application claims the benefit of Korean Patent Application No. 10-2002-0076956, filed on Dec. 5, 2002, which is incorporated herein in its entirety by reference.

BACKGROUND OF THE INVENTION

The present invention generally relates to memory devices and fabrication thereof, and more particularly, to floating gate nonvolatile memory cells and fabrication thereof.

Semiconductor memory devices may be classified into volatile memory devices and non-volatile memory devices. Generally, a volatile memory device loses data stored therein when a power supply to the cell is removed. In contrast, a non-volatile memory device typically does not lose data (or loses data at a relatively slow rate) when power is removed. DRAM and SRAM devices are generally classified as volatile memory devices and flash memory devices are classified as nonvolatile memory devices.

FIG. 1 is a cross-sectional view of a unit cell of a conventional flash memory device. FIG. 2 is an energy band diagram for a program operation of the flash memory cell, taken along a line I–I' of FIG. 1.

Referring to FIGS. 1 and 2, a gate pattern 6 comprises a tunnel oxide layer 2, a floating gate 3, a control gate insulation layer 4, and a control gate electrode 5 that are stacked on a substrate 1. Respective impurity diffusion layers 7 are formed in active regions at respective sides of the gate pattern 6. The impurity diffusion layers 7 correspond to source/drain regions, and a portion of the substrate 1 under the gate pattern 6 corresponds to a channel region 8. The floating gate 3 (where electrons are stored) is electrically isolated from the channel region.

The control gate electrode 5 plays a role in programming or erasing. In a program operation, a program voltage is applied to the control gate electrode 5 and a reference voltage is applied to the substrate 1 to cause electrons in the substrate 1 to tunnel through the tunnel oxide layer 2 and flow into the floating gate 3. In an erase operation, an erase voltage is applied to the control gate electrode 5 and a reference voltage is applied to the substrate 1 to cause electrons stored in the floating gate 3 to be released to the substrate 1. Typically, the program and erase voltages are higher than a power supply voltage applied to the device.

In the flash memory cell described above, electrons tunnel through the tunnel oxide layer 2 according to a Fowler-Nordheim tunneling mechanism (FN tunneling). Electrons typically tunnel through the tunnel oxide layer 2 across throughout the channel region 8. The manner in which electrons (or electrons and holes) tunnel through the tunnel oxide layer 2 will now be explained with reference to the energy band diagram of FIG. 2.

When data is written in the flash memory cell (i.e., during a program operation), a program voltage is applied to the control gate electrode 5, a reference voltage is applied to the substrate 1 and the source/drain regions 7 float. The program voltage is higher than the reference voltage. Therefore, the energy band of the tunnel oxide layer 2 inclines to thin widths of the upper and lower energy band. Thus, the electrons of a conduction band Ec of the channel region 8 tunnel through the thinned upper energy band by FN tunnel to the floating gate 3 (step A). The electrons that FN tunnel may increase as the width 10 of the upper energy band becomes thinner. In this case, holes in a valance band Ev of the floating gate 3 tunnel the thinned lower energy band of the tunnel oxide layer 2 to transfer to the channel region 8 (step B). The holes that tunnel also increase as the width 11 of the lower energy band decreases. The number of holes that tunnel generally is less than the number of electrons that tunnel due to the effective mass of the individual holes, which is greater than that of the individual electrons.

As flash memory devices become more highly integrated and low power consumption becomes increasingly desirable, it may be desirable to reduce program and erase voltages. In addition, improved endurance of flash memory devices is also desirable.

Endurance of a flash memory cell is generally reduced by repetition of program and erase operations. In particular, interface traps may be formed at the interface of the tunnel oxide layer 2 by the electrons that tunnel therethrough. The electrons may be caught in the interface traps when tunneling, such that the endurance of the flash memory device may be degraded. Holes, having an effective mass larger than electrons, can seriously affect the generation of the interface trap.

SUMMARY OF THE INVENTION

According to some embodiments of the present invention, a memory cell comprises a substrate having an active region defined therein. A tunnel insulation layer is disposed on the active region. A floating gate is disposed on the tunnel insulation layer. A gate interlayer dielectric layer is disposed on the floating gate. A control gate electrode is disposed on the gate interlayer dielectric layer. First and second source/drain regions are disposed on respective sides of the control gate electrode. A first one of the active region and the floating gate comprises a portion that protrudes towards a second one of the active region and the floating gate. In some embodiments, the protruding portion tapers toward the second one of the active region and the floating gate. The tunnel insulation layer may be narrowed at the protruding portion.

In further embodiments of the present invention, the active region comprises at least one protruding portion that protrudes toward the floating gate, and the floating gate comprises at least one protruding portion that protrudes toward the active region. The protruding portion may adjoin a device isolation layer. For example, the protruding portion may comprise an elongate, tapered region disposed between the device isolation layer and a planar portion of the first one of the active region and the floating gate. The source/drain regions may comprise respective impurity diffusion regions in the substrate.

According to further aspects of the present invention, methods of fabricating a memory cell are provided. A device isolation layer is formed in and/or on a substrate. The device isolation layer defines an active region. A tunnel insulation layer is formed on the active region. A floating gate on the tunnel insulation layer. A gate interlayer dielectric layer is formed on the floating gate. A control gate electrode is formed on the gate interlayer dielectric layer, and first and second source/drain regions are formed on respective sides of the control gate electrode. A first one of the active region and the floating gate comprises a portion that protrudes towards a second one of the active region and the floating gate.

In some embodiments, formation of the tunnel insulation layer is preceded by forming a spacer on a sidewall of the device isolation layer and in contact with the active region, wherein the spacer has etch selectivity with respect to the active region, etching the active region using the first spacer as a mask to form a recess in the active region bounded by a protruding portion of the active region underlying the spacer, and removing the spacer to expose the protruding portion of the active region. The tunnel insulation layer is formed by thermally oxidizing the exposed active region to form the tunnel isolation region and to taper the protruding portion of the active region.

In further embodiments, formation of the floating gate is preceded by forming a spacer on a sidewall of the device isolation layer and in contact with the tunnel insulation layer, forming a material pattern on the tunnel insulation layer adjacent the spacer. The spacer, the material pattern and the tunnel insulation layer are etched to expose the tunnel insulation layer and form a tapered groove therein. A floating gate that is disposed on the tunnel insulation layer and has a portion the protrudes into the tapered groove is then formed.

DETAILED DESCRIPTION

Figure 1:
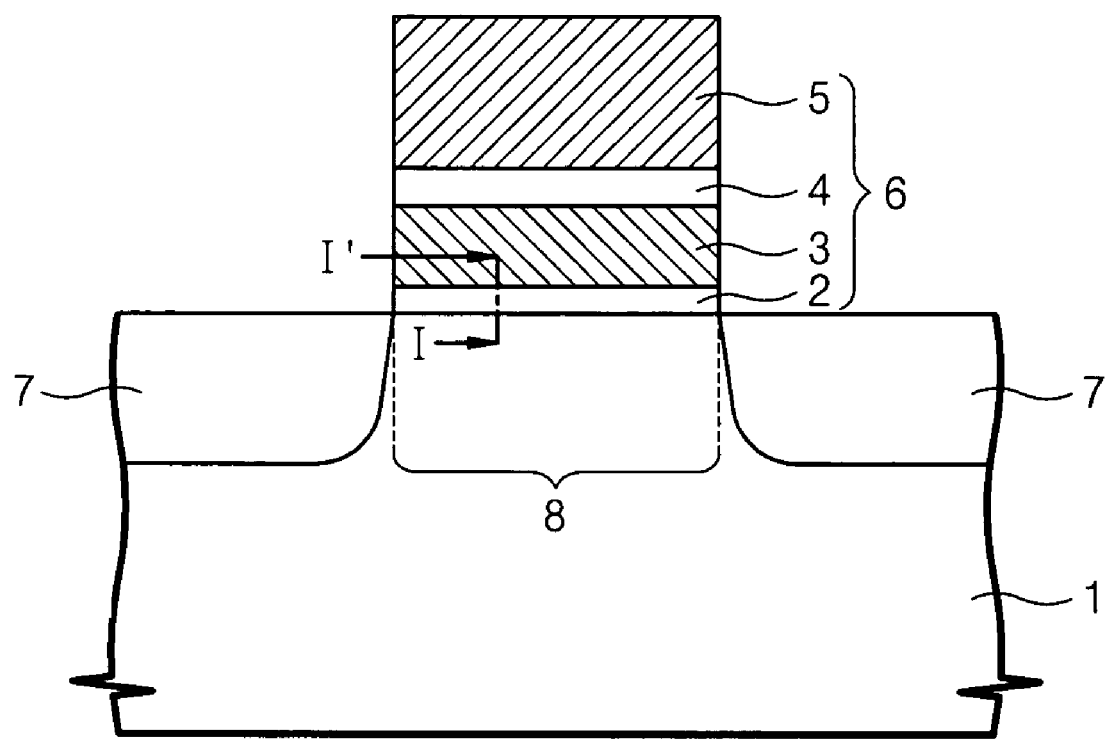
FIG. 1 is a cross-sectional view of a unit cell of a conventional flash memory device.

The present invention will be described more fully hereinafter with reference to the accompanying drawings, in which preferred embodiments of the invention are shown. This invention, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

Figure 3:
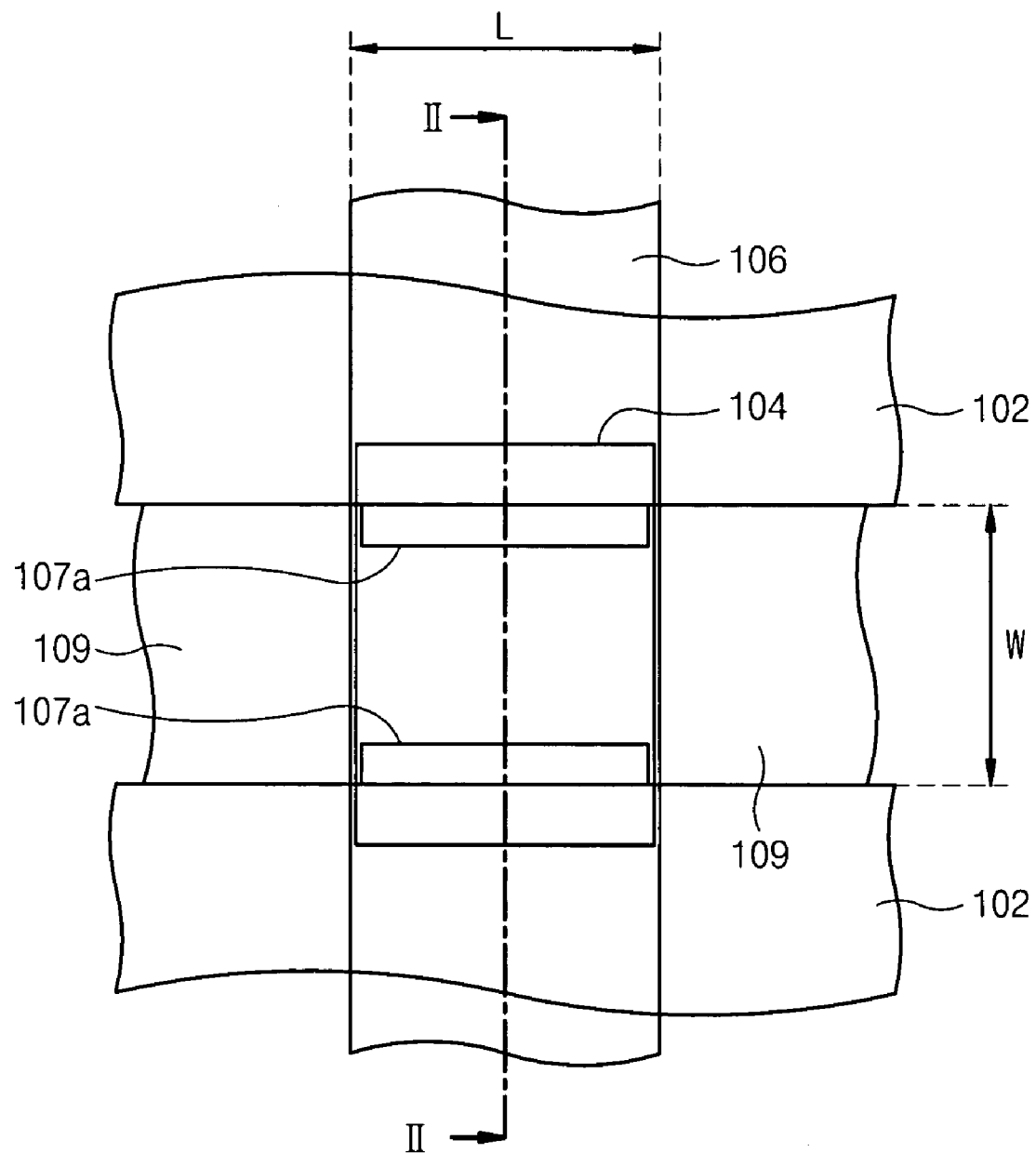
FIG. 3 is a top plane view of a nonvolatile memory cell according to some exemplary embodiments of the present invention.
Figure 4:
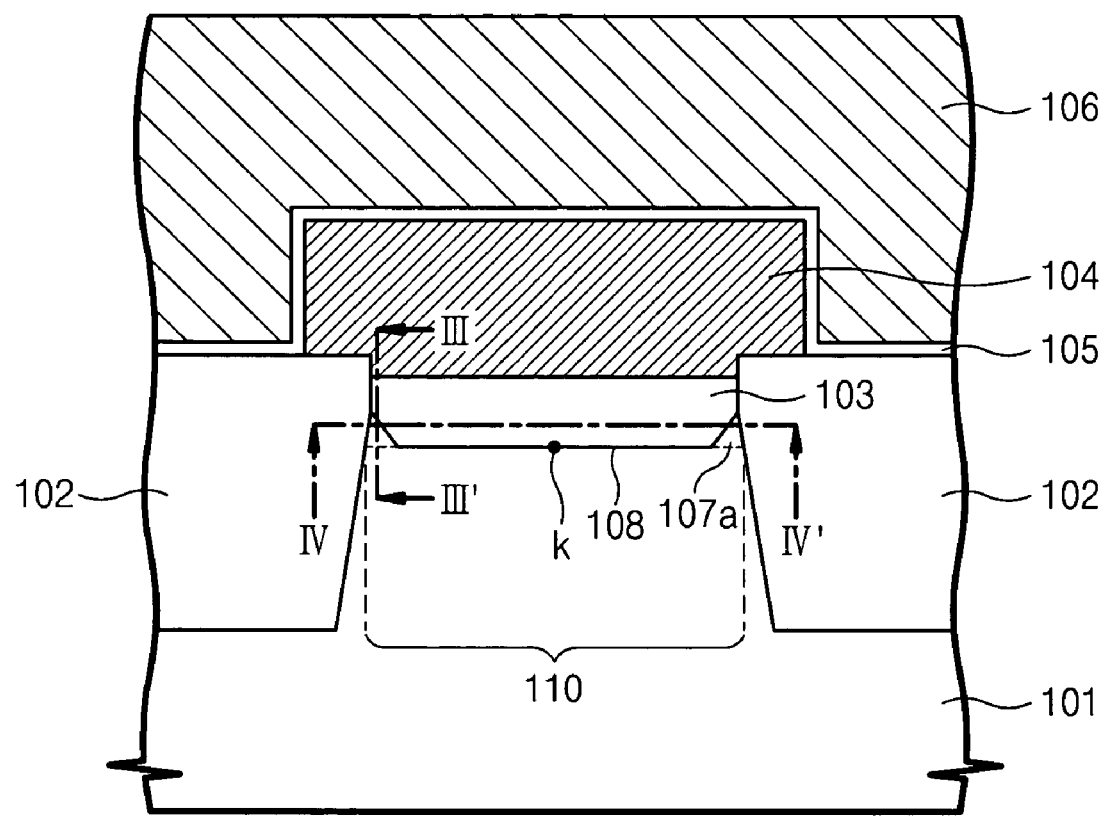
FIG. 4 is a cross-sectional view taken along a line II–II' of FIG. 3.

FIG. 3 is a top plane view of a nonvolatile memory cell according to an exemplary embodiment of the present invention. FIG. 4 is a cross-sectional view taken along a line II–II' of FIG. 3.

Referring to FIGS. 3 and 4, a device isolation layer 102 is disposed in and/or on a predetermined region of a substrate 101 to define an active region. The device isolation layer 102 may be formed of silicon oxide. A floating gate 104 is disposed over the active region. The floating gate 104 is electrically isolated from the substrate 101. The floating gate 104 may be formed of conductive material, for example, doped polysilicon. A tunnel insulation layer 103 is interposed between the floating gate 104 and the active region. In the exemplary embodiments, the tunnel insulation layer 103 is formed of thermal oxide. A control gate electrode 106 is disposed over the floating gate 104, crossing over the active region. A gate interlayer dielectric layer 105 is interposed between the floating gate 104 and the control gate electrode 106. The control gate electrode 106 may be formed of, for example, doped polysilicon or polycide. The polycide may be formed with a double-layered structure of doped polysilicon and metal silicide. The gate interlayer dielectric layer 105 may be formed of silicon oxide or oxide-nitride-oxide (ONO).

Impurity diffusion layers 109 are disposed in the active region at both sides of the control gate electrode 106. The impurity diffusion layers 109 serve as source/drain regions. The portion of the active region under the floating gate 104 corresponds to a channel region 110. The impurity diffusion layers 109 are separated from each other by a channel length L. The channel region 110 has a channel width W that is perpendicular to the channel length L.

At least one protruding portion 107a of the active region is disposed in the channel region 110. The protruding portion 107a may lie on a boundary between the active region and the device isolation layer 102. In the exemplary embodiments, the couple of protruding portions 107a are disposed under both edges of the floating gate 104. A surface of the active region within the channel region 110 includes two protruding portions 107a and a plane portion 108 therebetween. The protruding portion 107a becomes gradually narrower toward an edge, i.e., has a tapered shape. The tapered edge of the protruding portion 107a faces a bottom of the floating gate 104. The tunnel insulation layer 103 on the protruding portion 107a is thinner than the tunnel insulation layer 103 on the plane portion 108. The protruding portion 107a may extend parallel to the channel length L.

When a program or erase voltage is applied to the control gate electrode 106 so as to program or erase data of the nonvolatile memory cell, the electric field tends to concentrate at the edge of the protruding portion 107a neighboring the floating gate 104. Therefore, more electrons tunnel to the tunnel insulation layer 103 through the protruding portion 107a, which can thereby reduce the program or erase voltage. During the program or erase operation, the electrons tunnel the tunnel insulation layer 103 according to a Fowler-Nordheim tunneling mechanism.

Figure 5:
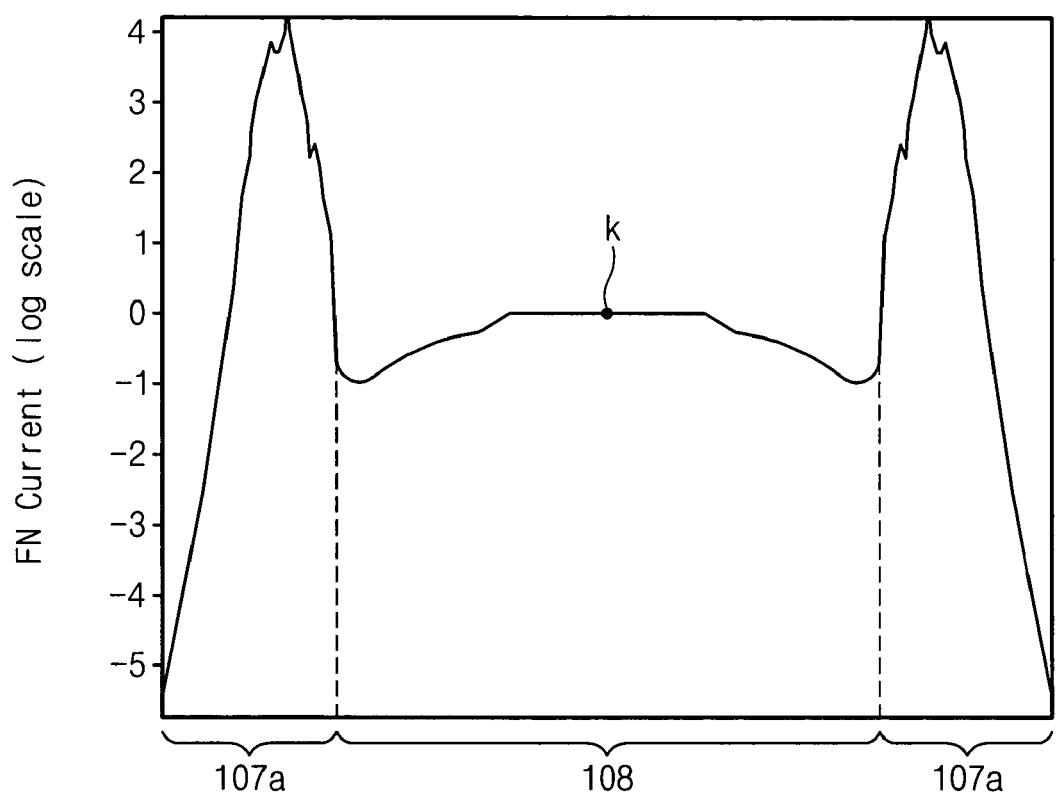
FIG. 5 is a graph showing FN current during a program operation of a nonvolatile memory device according to further embodiments of the present invention, taken along a ling III–III' of FIG. 4.
Figure 6:
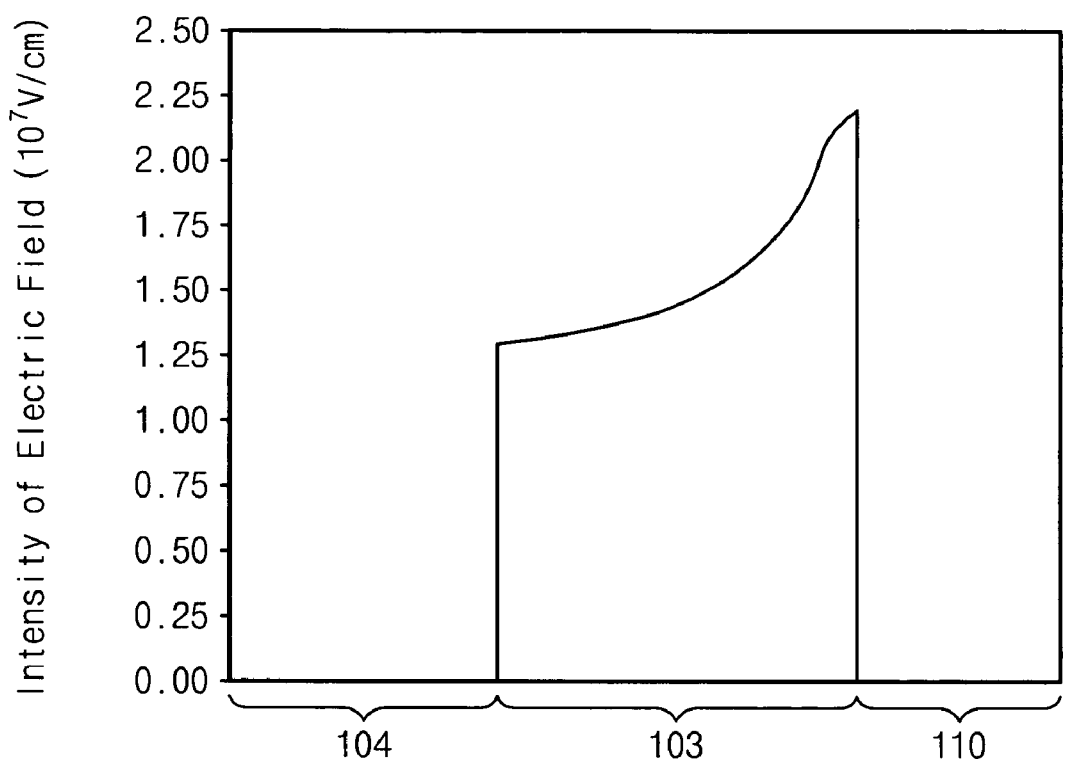
FIG. 6 is a graph showing electric field intensity during a program operation of nonvolatile memory cell according to further embodiments of the present invention, taken along a line IV–IV' of FIG. 4.

A simulation of the FN current that flows through the protruding portion 107a is illustrated in FIG. 5, while a simulation of the electric field at the edge of the protruding portion 107a is illustrated in FIG. 6. In particular, FIG. 5 is a graph showing FN current during a program operation of a nonvolatile memory device, taken along a ling III–III' of FIG. 4. FIG. 6 is a graph showing the electric field intensity during a program operation of nonvolatile memory cell, taken along a line IV–IV' of FIG. 4. In FIG. 5, the X-axis indicates a position along the line III–III' of FIG. 4 and the Y-axis indicates the FN current. In FIG. 6, the X-axis indicates a position along the line IV–IV' of FIG. 4 and the Y-axis indicates the electric field.

Referring to FIGS. 4, 5, and 6, 10V is applied to the floating gate 104 and 0V (i.e., a ground voltage) is applied to the substrate 101, while the source/drain regions 109 float. As illustrated in FIG. 5, the intensity of the electric field increases from the floating gate 104 to the edge of the protruding portion 107a, that is, the electric field intensity of the edge of the protruding portion 107a becomes around 1.6 times higher than at the boundary between the floating gate 104 and the tunnel insulation layer 103. As a result, electric field is concentrated on the edge of the protruding portion 107a.

As shown in FIG. 5, the FN current tunneling through the edge of the protruding portion 107a is higher in comparison to the current through the plane portion 108. In FIG. 5, the Y-axis indicates ratios to FN current tunneling through a central point "k" of the plane portion 108 in a common logarithm scale. As illustrated in FIG. 5, FN current that tunnels through the edge of the protruding portion 107a is about ten thousand times as large as the current of the central point "k" of the plane portion 108. This is because the tunnel insulation layer 103 on the edges of the protruding portion 107a is substantially thinner than at the plane portion 108. If the tunnel insulation layer 103 is not substantially thinner, the FN current of the edge of the protruding portion 107a is about one thousand times as large as the FN current of the plane portion 108 of the active region.

When the nonvolatile memory cell is erased, intensity of the electric field increases at the edge of the protruding portion 107a. Thus, more electrons are released from the floating gate 104 at the protruding portion 107a than at the plane portion 108. As a result, during a program or an erase operation, the electrons that tunnel the tunnel insulation layer 103 increase compared to those of the conventional flash memory cell. Therefore, the nonvolatile memory cell can used reduced program or erase voltages.

Nonvolatile memory cells according to some embodiments of the present invention can also decrease the holes that tunnel the tunnel insulation layer 103. This will be explained with reference to FIG. 7, which is an energy band diagram of a nonvolatile memory cell according to some embodiments of the present invention during a program operation, taken along the line III–III' of FIG. 4.

Figure 2:
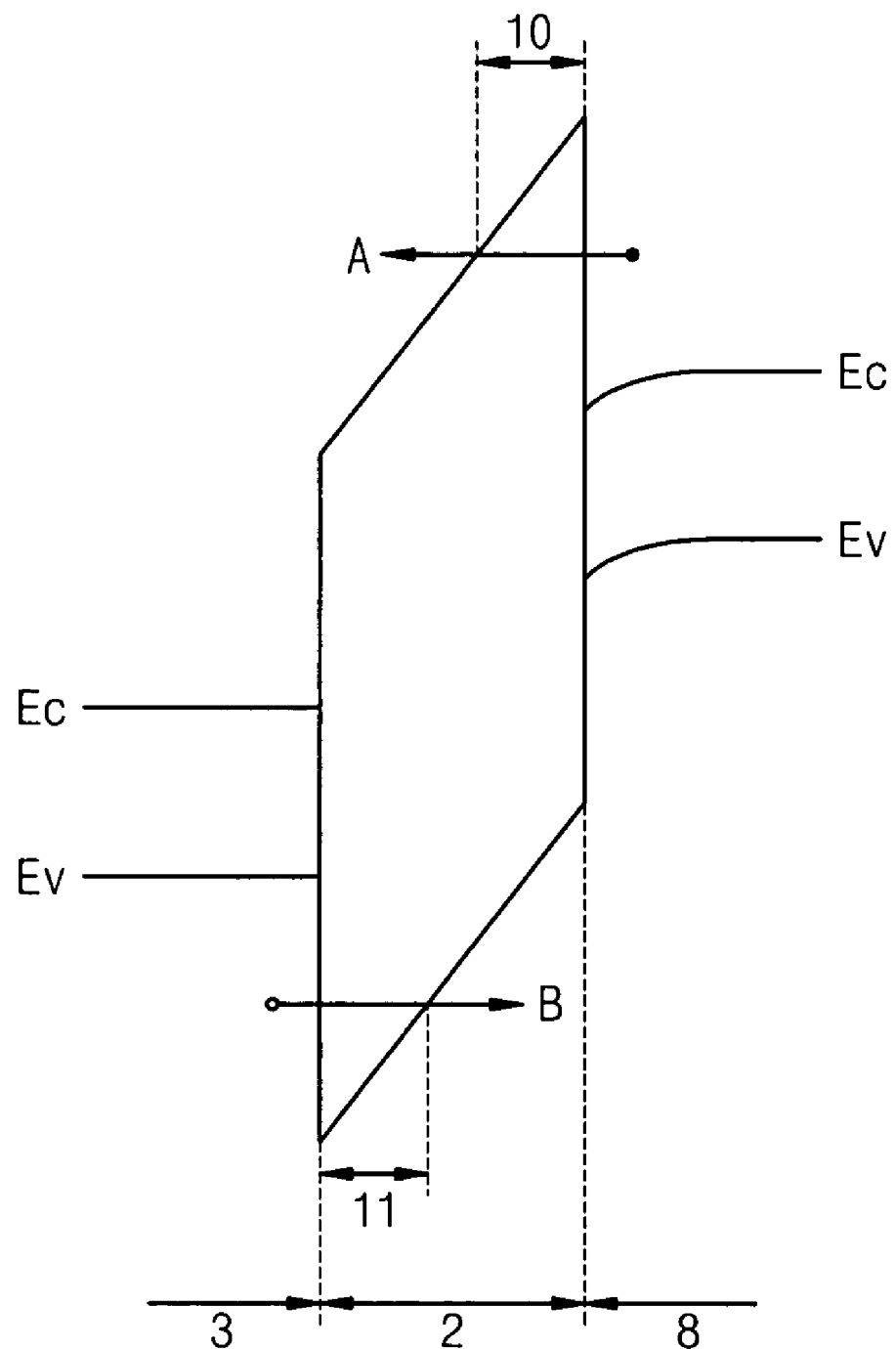
FIG. 2 is an energy band diagram during a program operation of a conventional flash memory cell, taken along a line I–I' of FIG. 1.
Figure 7:
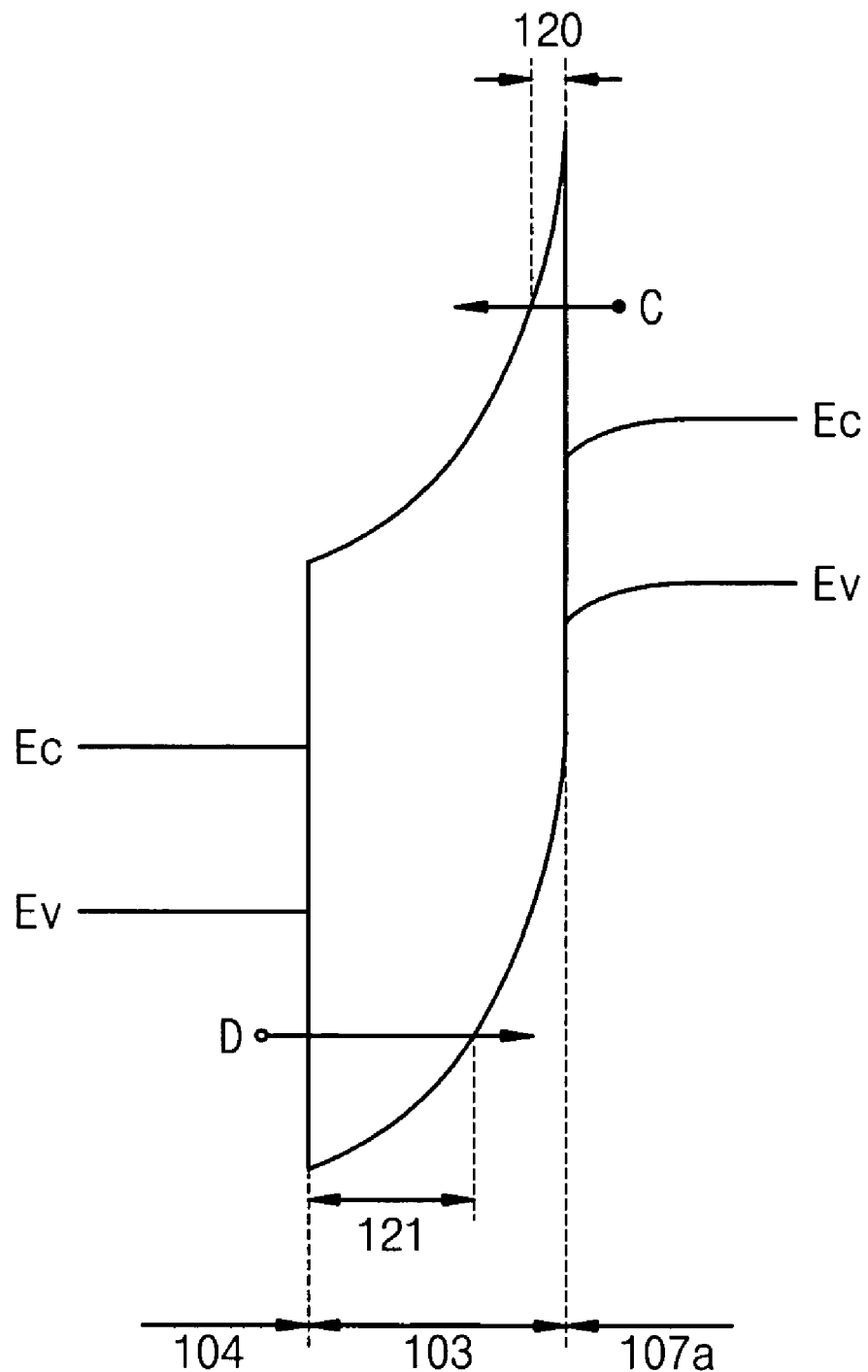
FIG. 7 is an energy band diagram of nonvolatile memory cell during a program operation according to some embodiments of the present invention, taken along the line III–III' of FIG. 4.

Referring to FIGS. 2, 4 and 7, near the protruding portion 107a, intensity of the electric field increases, such that upper energy bandwidth 120 of the tunnel insulation layer 103 is narrower than lower energy bandwidth 121. Thus, more electrons tunnel from a conduction band Ec of the protruding portion 107a through the upper energy band width 120.

On the contrary, the lower energy band width 121, where holes of the floating gate 104 tunnel, becomes wider than the lower energy band width 11 of FIG. 2. Therefore, the holes which tunnel the tunnel insulation layer 103 from the floating gate 10 are reduced. As a result, interface traps that form at the interface of the tunnel insulation layer 103 can be reduced, and endurance of the nonvolatile memory cell can be improved.

Figure 8:
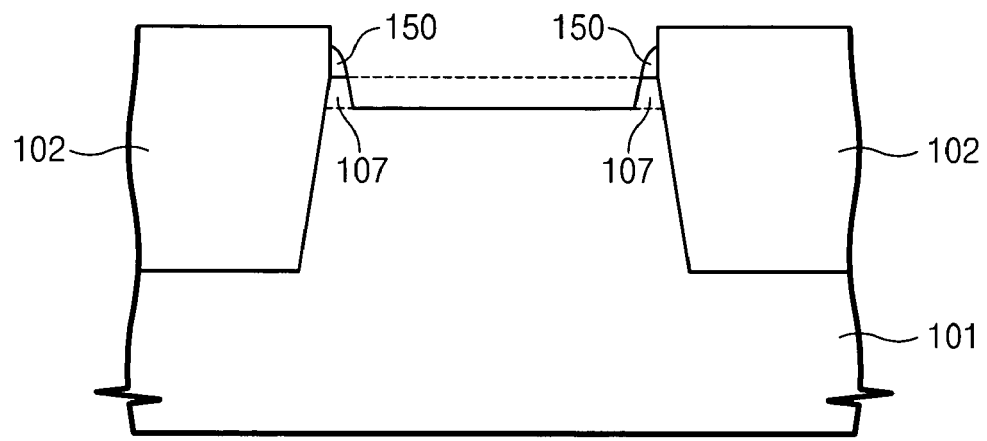
FIGS. 8 and 9 are cross-sectional views showing exemplary operations for forming a nonvolatile memory cell according to some embodiments of the present invention, taken along the line II–II' of FIG. 3.
Figure 9:
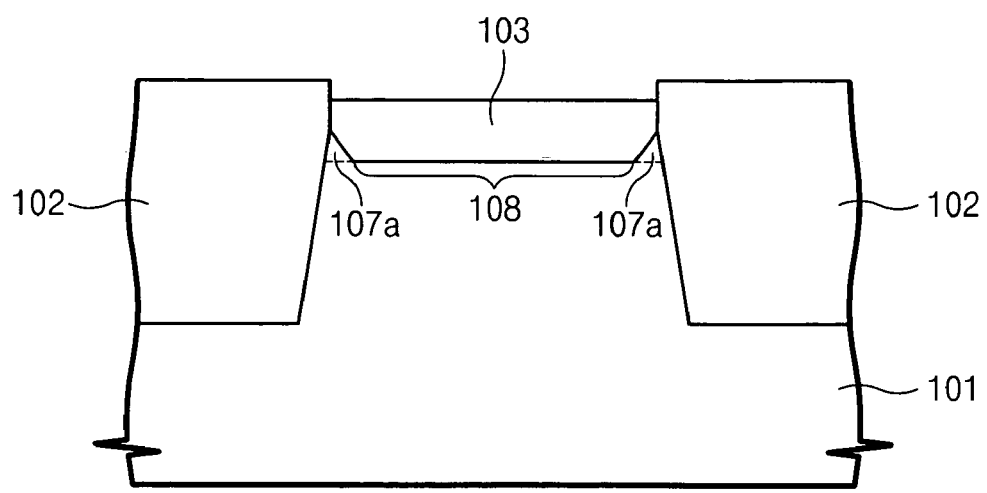

FIGS. 8 and 9 are cross-sectional views showing steps of forming a nonvolatile memory cell, taken along the line II–II' of FIG. 3, according to further embodiments of the present invention.

Referring to FIGS. 3, 4, 8, and 9, a device isolation layer 102 that defines an active region is formed in a substrate 101. An upper portion of a sidewall of the device isolation layer 102 may be exposed. The device isolation layer 102 may be formed using, for example, trench device isolation techniques. The device isolation layer 102 may comprise silicon oxide.

Respective spacers 150 are formed on the exposed sidewalls of the device isolation layer 102 at respective sides of the active region. In the exemplary embodiment, the spacers 150 are formed of material having etch selectivity with respect to the active region. A patterning process may be further performed that positions the spacers 150 only under the floating gate 104 of FIG. 3. However, such a patterning process may be omitted. The spacers 150 may comprise silicon nitride.

Using the spacers 150 and the device isolation layer 102 as a mask, the active region is recessed to form preliminary protruding portions 107 of the active region under the spacers 150, and a plane portion 108 of the active region. The spacers 150 are removed to expose the preliminary protruding portions 107. A tunnel insulation layer 103 is formed on the active region with the preliminary protruding portion 107. In the exemplary embodiments, the tunnel insulation layer 103 is formed of a thermal oxide.

Edges of the preliminary protruding portions 107 are tapered by the thermal oxidation process to form protruding portions 107a. The portions of the tunnel insulation layer 103 neighboring the device isolation layer 102 may be thinner than the portion of the tunnel insulation layer 103 on the plane portion 108.

A floating gate 104, a gate interlayer dielectric layer 105, and a control gate electrode 106 are then formed to provide the structure illustrated in FIG. 4. In particular, a preliminary floating gate (not shown) is formed on the tunnel insulation layer 103, over the active region. An interlayer dielectric layer (not shown) and a control gate electrode layer (not shown) are sequentially formed on the substrate 101 with the preliminary floating gate. The control gate electrode, the interlayer dielectric layer and the preliminary floating gate are successively patterned to form the floating gate 104, the gate interlayer dielectric layer 105, and the control gate electrode 106. The control gate electrode 106 crosses over the active region. Impurity ions are implanted into the active regions at both side of the control gate electrode 106 to form impurity diffusion regions 109. In alternative embodiments, the floating gate 104 and the control gate electrode 106 may be sequentially formed.

In further exemplary embodiments of the present invention, a nonvolatile memory cell includes a floating gate having a protruding bottom portion.

Figure 10:
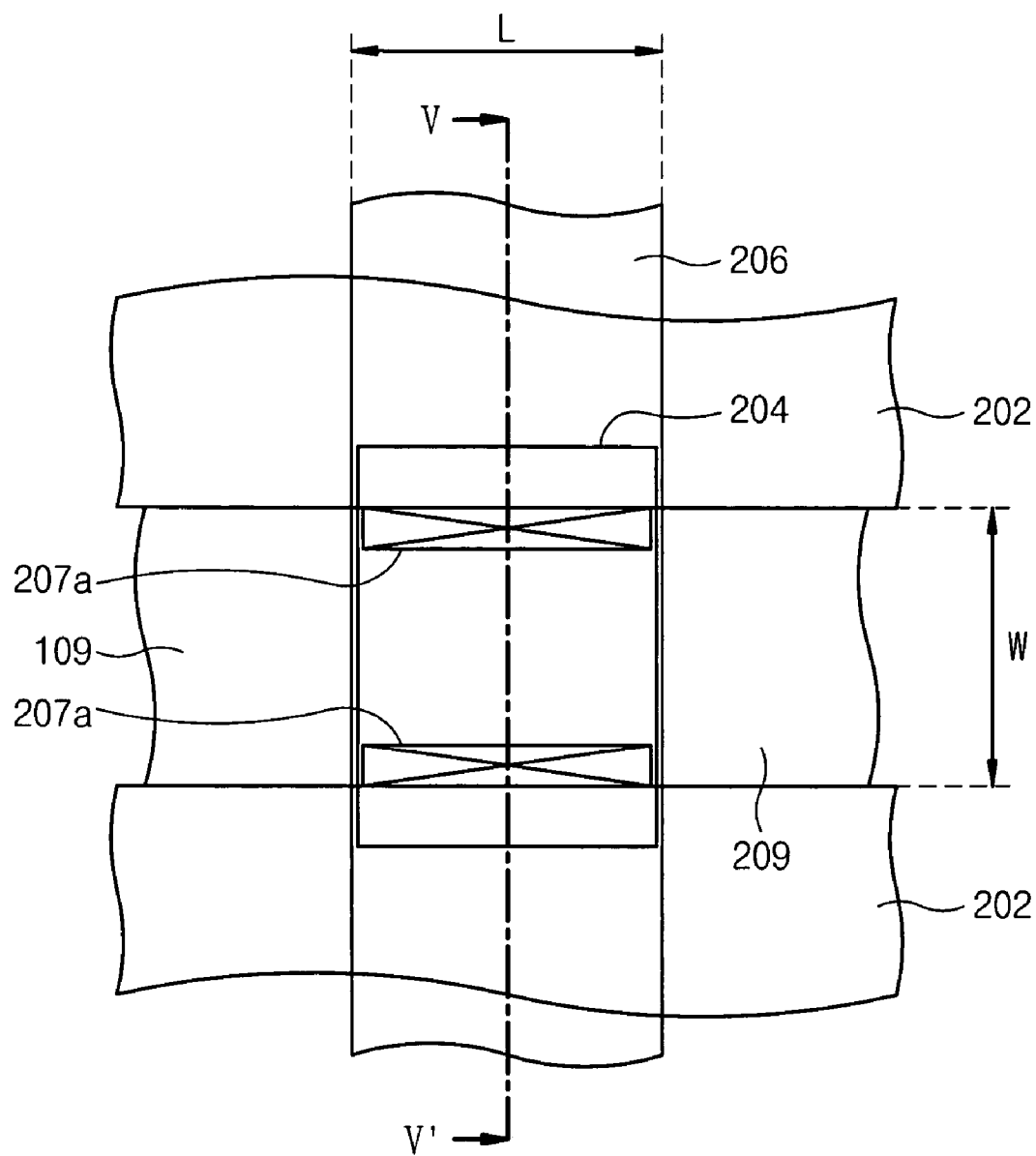
FIG. 10 is a top plane view of a nonvolatile memory device according to additional exemplary embodiments of the present invention.
Figure 11:
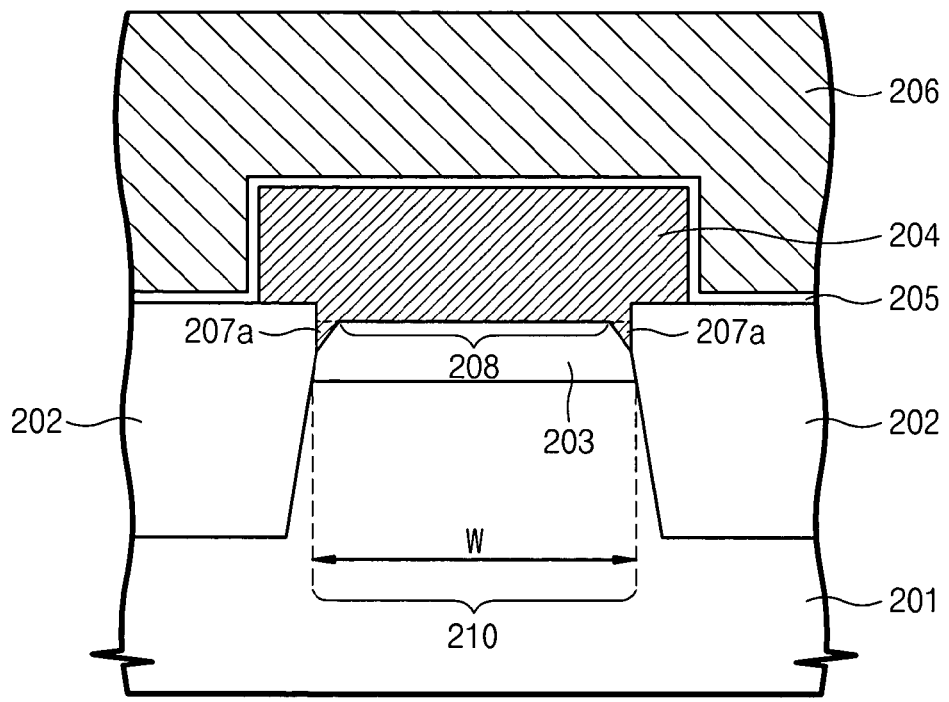
FIG. 11 is a cross-sectional view taken along a line V–V' of FIG. 10.

FIG. 10 is a top plane view of a nonvolatile memory device according to some exemplary embodiments of the present invention. FIG. 11 is a cross-sectional view taken along a line V–V' of FIG. 10.

Referring to FIGS. 10 and 11, a device isolation layer 202 is disposed in a substrate 201 to define an active region. A floating gate 204 is disposed over the active region. A tunnel insulation layer 203 is interposed between the floating gate 204 and the active region. The device isolation layer 202 may comprise silicon oxide. The floating gate 204 may be formed of conductive material, for example, doped polysilicon. The tunnel insulation layer 203 may comprise thermal oxide.

A control gate electrode 206 is disposed on the floating gate 204. A gate interlayer dielectric layer 205 is interposed between the control gate electrode 206 and the floating gate 204. The control gate electrode 206 may comprise doped polysilicon and/or polycide, e.g., doped polysilicon and metal silicide that are stacked. The gate interlayer dielectric layer 205 may be formed of silicon oxide or ONO. Impurity diffusion layers 209 are disposed in the active region at both sides of the control gate electrode 206. A couple of impurity diffusion layers 209 form source/drain regions. The active region 210 under the floating gate 204 corresponds to a channel region 210. The impurity diffusion layers 209 are separated from each other a channel length L of the channel region 210. The channel region 210 has a channel width W perpendicular to the channel length L.

At least one protruding portion 207a is disposed on a bottom of the floating gate 204. The protruding portion 207a may be located on a boundary between the active region and the device isolation layer 202, e.g., a couple of protruding portions 207a of the active region may be disposed on respective edges of the bottom of the floating gate 204. The bottom of the floating gate 204 may comprise a couple of protruding portions 207a and a plane portion 208 between the couple of protruding portions 207a. The protruding portion 207a has a tapered shape. The tapered edge of the protruding portion 207a faces the active region. The tunnel insulation layer 203 under the protruding portion 207a may be thinner than the tunnel insulation layer 203 under the plane portion 208. The protruding portion 207a may extend parallel to the channel length L.

In a nonvolatile memory cell according to exemplary embodiments of the present invention illustrated in FIGS. 10 and 11, when a program or an erase voltage is applied to the control gate electrode 206, electric field concentrates at the tapered edge of the protruding portions 207a. Therefore, more electrons tunnel the tunnel insulation layer 203 near the protruding portions 107a, i.e., current increases and, as a result, the program or erase voltage can be reduced. In addition, the number of holes which tunnel the tunnel insulation layer 203 are reduced, which can improve the endurance of the nonvolatile memory cell.

Figure 12:
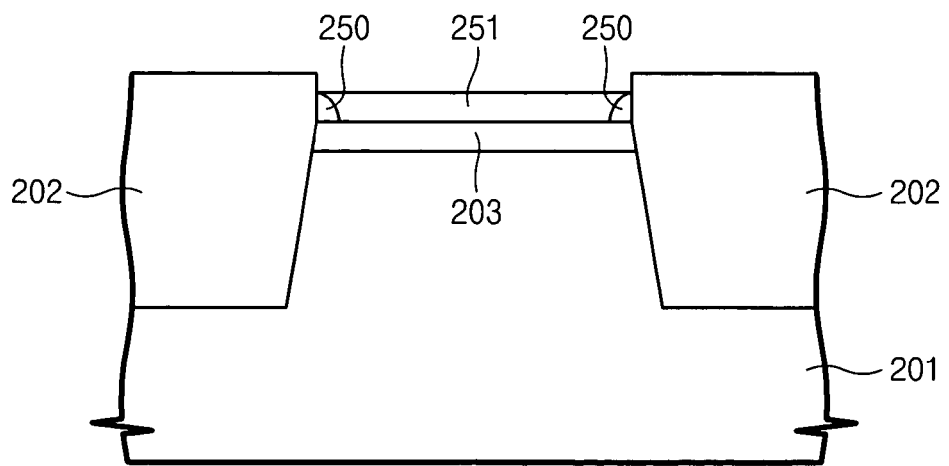
FIGS. 12 and 13 are cross-sectional views showing exemplary operations for forming a nonvolatile memory cell according to some embodiments of the present invention, taken along the line V–V' of FIG. 10.
Figure 13:
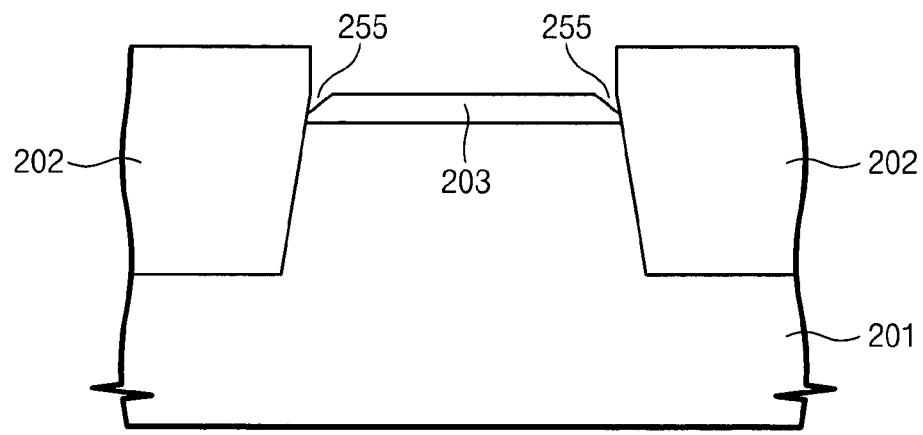

FIGS. 12 and 13 are cross-sectional views showing steps of forming the nonvolatile memory cell of FIGS. 10 and 11, taken along the line V–V' of FIG. 10. Referring to FIGS. 10, 11, 12, and 13, a device isolation layer 202 that defines an active region is formed in a substrate 201. Upper portions of the sidewalls of the device isolation layer 202 may be exposed. The device isolation layer 202 may be a trench device isolation layer. A tunnel insulation layer 203 is formed on the active region. The tunnel insulation layer 203 may comprise thermal oxide. A portion of the exposed upper sidewall of the device isolation layer 202 is still exposed on the tunnel insulation layer 203.

Spacers 250 are formed on the exposed sidewalls of the device isolation layer 202. Bottoms of the spacers 250 contact a top surface of the tunnel insulation layer 203. A material pattern 251 is formed between the spacers 250. A top surface of the material pattern 251 may extend to the top of the spacers 250 in height. To form the material pattern 251, a material layer (not shown) may be formed on the substrate 201 with the spacers 250 and then planarized using the spacers 250 as a etch stop layer.

Sidewalls of the material pattern 251 are curved where the pattern 251 contacts the spacers 250. The spacers 250 may comprise silicon nitride and the material pattern 251 may be formed of polysilicon.

The spacers 250 and the material pattern 251 are removed by anisotropic etching. The etch rate of the spacers 250 is higher than that of the material pattern 251 and the tunnel insulation layer 203. Therefore, the tunnel insulation layer 203 under the spacers 250 may be exposed before the material pattern 251 is entirely etched, such that the exposed tunnel insulation layer 203 is etched to form grooves 255 at respective sides thereof. Each of the grooves 255 is tapered toward the sidewall of the material pattern 251. During the anisotropic etching process, the material pattern 251 and the tunnel insulation layer 203 may be etched at an identical rate.

The floating gate 204 shown in FIGS. 10 and 11 is formed on the tunnel insulation layer. A portion of the floating gate 204 fills the grooves 255 under the floating gate 204. The portion of the floating gate 204 formed in the grooves 255 corresponds to the protruding portion 207a of FIG. 11.

A gate interlayer dielectric layer 205 and a control gate electrode 206, which are illustrated in FIGS. 10 and 11, are formed on the floating gate 204. The floating gate 204, the gate interlayer dielectric layer 205, and the control gate electrode 206 may be formed in the same way as the first exemplary embodiments. While the floating gate 204 is formed, portions of a tunnel insulation layer 303 may be removed at both sides of the floating gate 204. Impurity ions may then be implanted into the active region at both sides of the control gate electrode 206 to form impurity diffusion regions 209. As a result, the nonvolatile memory cell of FIGS. 10 and 11 can be formed.

Figure 14:
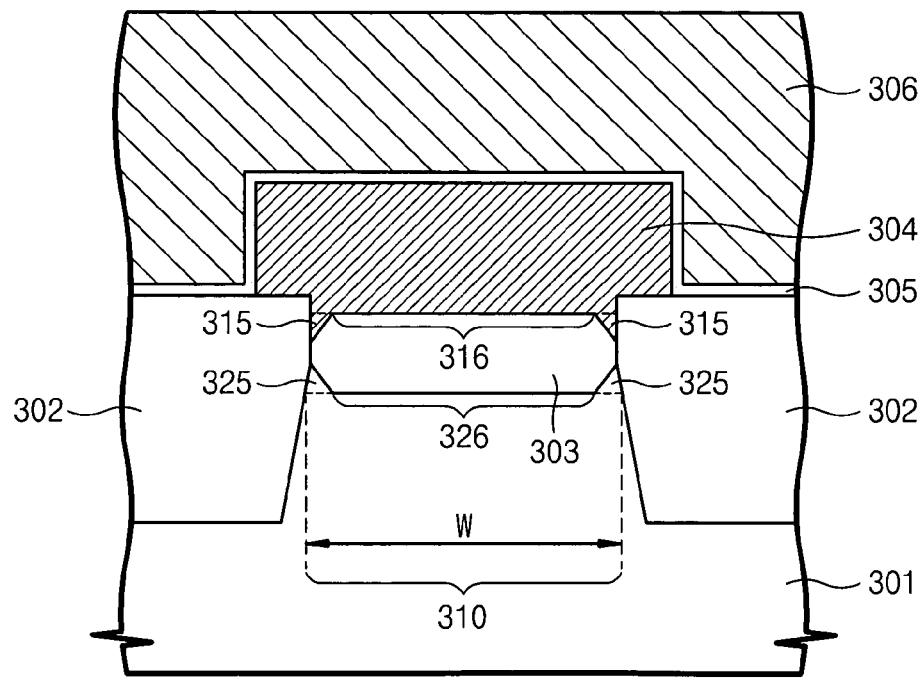
FIG. 14 is a cross-sectional view of a nonvolatile memory cell according to still further exemplary embodiments of the present invention.

A nonvolatile memory cell according to still further exemplary embodiments shown in FIG. 14 includes an active region with at least one protruding portion (along the lines of the embodiments of FIGS. 3 and 4) and a floating gate with at least one protruding portion (along the lines of the embodiments of FIGS. 10 and 11). Referring to FIG. 14, a device isolation layer 302 is disposed in a predetermined region of a substrate 301 and defines an active region. A floating gate 304 is disposed on the active region. A tunnel insulation layer 303 is interposed between the floating gate 304 and the active region. A control gate 306 is disposed on the floating gate 304. A gate interlayer dielectric layer 305 is interposed between the control gate electrode 306 and the floating gate 304. A portion of the active region under the floating gate 304 corresponds to a channel region 310. At least one first protruding portion 325 of the active region protrudes from a top portion of the active region in the channel region 310. In addition, at least one second protruding portion 315 protrudes from a bottom of the floating gate 304. The second protruding portion 315 protrudes toward the active region. The surface of the channel region 310 comprises the first protruding portion 325 and a first plane portion 326 of the active region. The bottom of the floating gate 314 comprises the second protruding portion 315 and a second plane portion 316. The first and second protruding portions 325 and 315 have a tapered shape.

The first and second protruding portions 325 and 315 may be located near a boundary between the active region and the device isolation layer 302. In the illustrated embodiments, the tunnel insulation layer 303 between the first and second protruding portions 325 and 315 may be thinner than that between the first and second plane portions 326 and 316.

When a program or erase voltage is applied to the nonvolatile memory cell with the first and second protruding portions 325 and 315, electric field is concentrated at the first and second protruding portions 325 and 315. As a result, the program and erasing voltages can be reduced. The first and second protruding portions 325 and 315 may extend parallel to the channel length of the channel region 310. The nonvolatile memory cell shown in FIG. 14 may be formed using the operations described above with reference to FIGS. 8, 9, 12 and 13.

Figure 15:
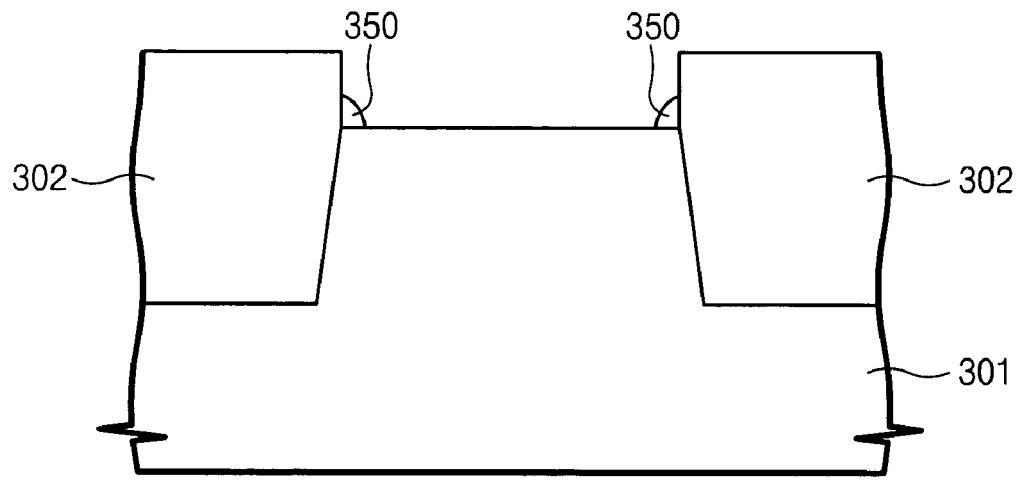
FIGS. 15 through 17 are cross-sectional views illustrating exemplary operations for forming the nonvolatile memory device of FIG. 14.
Figure 16:
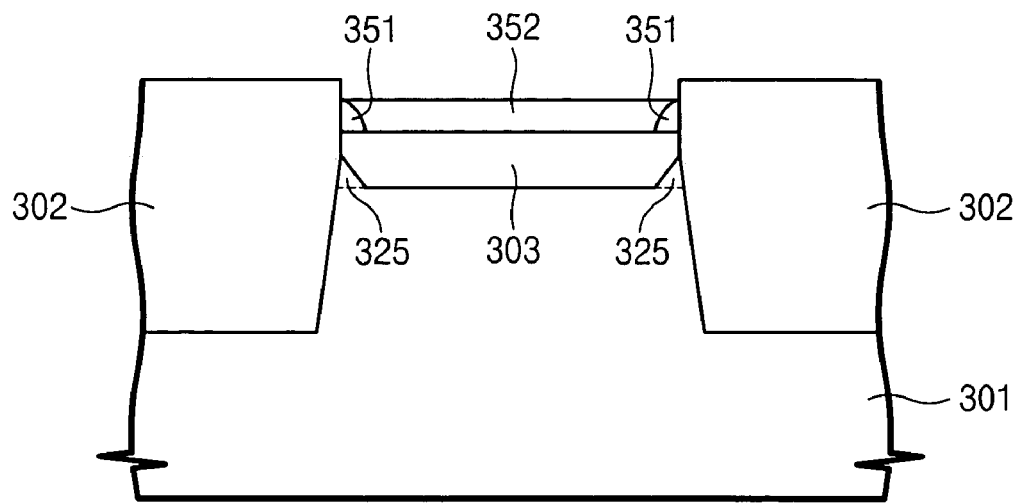
Figure 17:
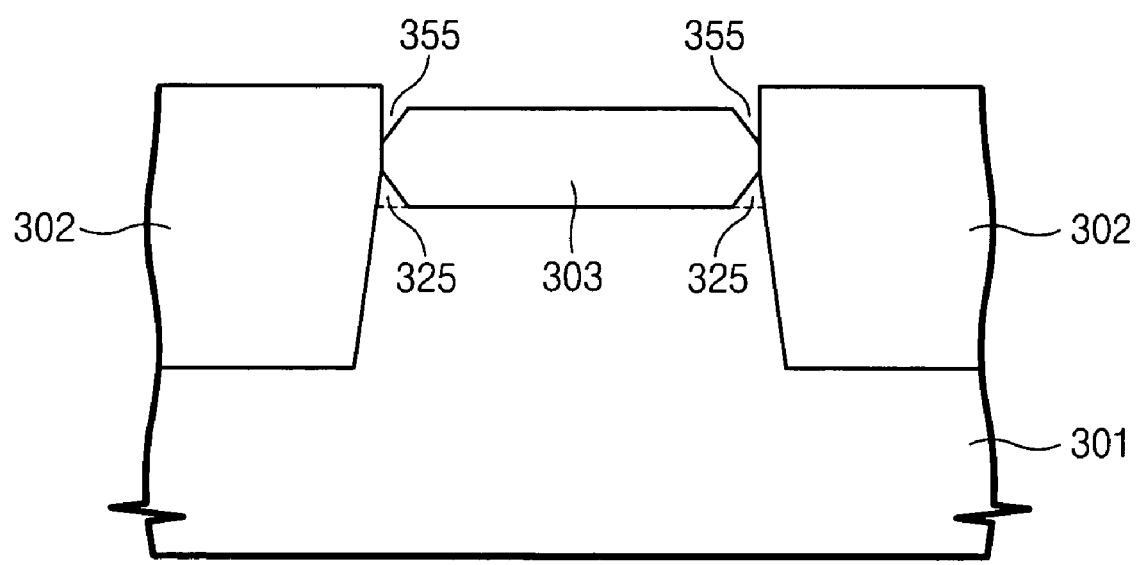

FIGS. 15 through 17 are cross-sectional views illustrating exemplary operations for forming the nonvolatile memory device of FIG. 14. Referring to FIGS. 14, 15, 16, and 17, a device isolation layer 302 that defines an active region 302 is formed in a substrate 301. Upper portions of the sidewalls of the device isolation layer 302 may be exposed. First spacers 350 are formed on the exposed sidewalls of the device isolation layer 302. The first spacers 350 may be formed of material, for example, silicon nitride, having etch selectivity with respect to the active region. In the exemplary embodiments, a patterning process is further performed so as to form the first spacers 350 only in the channel region. However, the patterning of the first spacers 350 may be omitted.

Using the device isolation layer 301 and the first spacers 350 as a mask, the active region is recessed to protrude the active region under the first spacers 350. The first spacers 350 are then removed. A tunnel insulation layer 303 and first protruding portions 325 are formed by thermal oxidation of the recessed active region. The first protruding portions 325 have a tapered shape.

Second spacers 351 are formed on the exposed sidewalls of the device isolation layers 302 and on the tunnel insulation layer 303. A material pattern 352 is formed on the active region between the second spacers 351. In the exemplary embodiments, a top surface of the material pattern 352 extends as high as the top of the second spacer 351. Each of the second spacers 351 may be formed of silicon nitride, and the material pattern 352 may be formed of polysilicon.

The second spacers 351 and the material pattern 352 are removed by an anisotropic etching process. The anisotropic etch ratio of the second spacer 351 is higher than that of the material pattern 352 and the tunnel insulation layer 303. Thus, grooves 355 are formed in the tunnel insulation layer 303. The grooves 355 have a tapered shape. The anisotropic etching process may etch the material pattern 251 and the tunnel insulation layer 203 at an identical rate.

A floating gate 304, a gate interlayer dielectric layer 305 and a control gate electrode 306 are then formed on the tunnel insulation layer 303 with the grooves. A bottom portion of the floating gate 304 fills in the grooves 255 under the floating gate 304. The portions of the floating gate 304 which is formed in the groove 355 corresponds to the second protruding portions 315. The floating gate 304 and the control gate electrode 306 may be formed in the same way as described above with reference to FIGS. 8 and 9. Impurity diffusion regions 309 are formed in the active region respective sides of the control gate electrode 306. As a result, the nonvolatile memory cell of FIG. 14 can be formed.

According to some embodiments of the present invention, a nonvolatile memory cell includes at least one protruding portion that is formed by protrusion of a bottom portion of a floating gate or a top portion of active region under the floating gate. The protruding portion may have a tapered shape, such that electric field is concentrated near edges of the protruding portion, and such that FN current increases. As a result, program and/or erase voltage of the nonvolatile memory cell can be reduced. In addition, the concentrated electric filed may increase a lower energy band width of the tunnel insulation layer, such that the amount of holes tunneling the tunnel insulation layer can be decreased. Thus, endurance of the nonvolatile memory device can be improved.

What is claimed is:

1. A memory cell comprising:
   a substrate having an active region defined therein;
   a tunnel insulation layer on the active region;
   a floating gate disposed on the tunnel insulation layer;
   a gate interlayer dielectric layer on the floating gate;
   a control gate electrode on the gate interlayer dielectric layer; and
   first and second source/drain regions on respective sides of the control gate electrode,
   wherein a first one of the active region and the floating gate comprises a portion that protrudes towards a second one of the active region and the floating gate.

2. The memory cell of claim 1, wherein the protruding portion tapers toward the second one of the active region and the floating gate.

3. The memory cell of claim 1, wherein the tunnel insulation layer is narrowed at the protruding portion.

4. The memory cell of claim 1, wherein the active region comprises at least one protruding portion that protrudes toward the floating gate and wherein the floating gate comprises at least one protruding portion that protrudes toward the active region.

5. The memory cell of claim 1, wherein the protruding portion adjoins the device isolation layer.

6. The memory cell of claim 5, wherein the protruding portion comprises an elongate, tapered region disposed between the device isolation layer and a planar portion of the first one of the active region and the floating gate.

7. The memory cell of claim 1, wherein the source/drain regions comprise respective impurity diffusion regions in the substrate.

* * * * *